(12) United States Patent
Finn et al.

(10) Patent No.: US 10,074,409 B2
(45) Date of Patent: Sep. 11, 2018

(54) CONFIGURABLE STORAGE BLOCKS HAVING SIMPLE FIRST-IN FIRST-OUT ENABLING CIRCUITRY

(71) Applicant: Intel Corporation, Santa Clara, CA (US)

(72) Inventors: Simon Finn, High Wycombe (GB); Carl Ebeling, Redwood City, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/421,090

(22) Filed: Jan. 31, 2017

(65) Prior Publication Data

US 2018/0218760 A1    Aug. 2, 2018

(51) Int. Cl.
*G11C 7/10* (2006.01)
*G11C 8/00* (2006.01)

(52) U.S. Cl.
CPC .............. *G11C 7/1012* (2013.01); *G11C 8/00* (2013.01)

(58) Field of Classification Search
CPC ................................ G11C 7/1012; G11C 8/00
USPC .................................................... 365/189.02
See application file for complete search history.

(56) References Cited

U.S. PATENT DOCUMENTS

| 4,785,415 A | 11/1988 | Karlquist |
| 5,768,196 A | 6/1998 | Bloker et al. |
| 6,262,597 B1 | 7/2001 | Bauer et al. |
| 6,857,043 B1 | 2/2005 | Lee et al. |
| 7,072,998 B2* | 7/2006 | Huang ........................ G06F 5/08 710/52 |
| 7,310,396 B1 | 12/2007 | Sabih |
| 8,248,869 B1 | 8/2012 | Chan et al. |
| 9,178,513 B1 | 11/2015 | Hutton et al. |
| 2009/0089538 A1 | 4/2009 | Yeh et al. |
| 2010/0088479 A1* | 4/2010 | Kiuchi ..................... H04L 49/90 711/154 |
| 2011/0209002 A1* | 8/2011 | Chopra ................. G06F 11/263 714/30 |

FOREIGN PATENT DOCUMENTS

EP    3067894 A1    9/2016

* cited by examiner

*Primary Examiner* — Huan Hoang
(74) *Attorney, Agent, or Firm* — Treyz Law Group, P.C.; Tianyi He; Joseph F. Guihan

(57) ABSTRACT

An integrated circuit may have configurable storage blocks. A configurable storage block may include a memory array, and arithmetic and control circuitry. The arithmetic and control circuitry may be used to determine whether to operate the configurable storage block in a first mode which may provide random access to the memory array or in a second mode which may provide access to the memory array in a predefined order. Thus, the configurable storage block may implement simple first-in first-out modules and shift registers in addition to implementing memory modules with random access. Arithmetic and control circuitry may include a multiplexer that determines whether the configurable storage block is implementing simple first-in first-out modules or shift registers. When the configurable storage block implements first-in first-out modules, an up-down counter may be activated to generate a count value received at the multiplexer.

12 Claims, 8 Drawing Sheets

CONFIGURABLE STORAGE BLOCKS HAVING SIMPLE FIRST-IN FIRST-OUT ENABLING CIRCUITRY

BACKGROUND

The embodiments presented herein relate to integrated circuits and, more particularly, to configurable storage blocks in an integrated circuit.

As applications for which programmable integrated circuits are used increase in complexity, it has become more common to design programmable integrated circuits to include specialized blocks such as configurable storage blocks in addition to blocks of generic programmable logic.

Configurable storage blocks are often arranged in arrays of memory elements. In a typical array, data lines are used to write data into and read data from the configurable storage blocks. Address lines may be used to select which of the memory elements are being accessed. A configurable storage block is typically configurable to implement a memory of a given depth and width, whereby the maximum depth is based on the number of address lanes and the maximum width on the number of data lanes.

Furthermore, programmable integrated circuits often include simple registers without an input for enable signals. Errors can occur if simple registers are continuously enabled to output data without pause, even when downstream circuitry is not ready to receive the output data.

It is within this context that the embodiments herein arise.

SUMMARY

It is appreciated that the present invention can be implemented in numerous ways, such as a process, an apparatus, a system, a device, or instructions executed on a programmable processor. Several inventive embodiments are described below.

In accordance with an embodiment, a configurable storage circuit may include control and arithmetic circuitry and a memory array. The control and arithmetic circuitry may access the memory array during different modes of operation (e.g., a random access memory (RAM) mode, a shift register mode, a simple first-in first-out (FIFO) mode, etc.)

The control and arithmetic circuitry may include a write address generation circuit (e.g., a monotonic counter circuit) that generates a write address for accessing the memory array. The control and arithmetic circuitry may also include a mode control circuit that receives a length value and generates a read address for accessing the memory array based on the received length value. To generate the read address, a corresponding count value may be first generated based on the received length value.

The control and arithmetic circuitry may further include a multiplexing circuit and an up-down counter that is different from the monotonic counter circuit within the write address generation circuit. The up-down counter may "count up" (e.g., increase a stored count value) when only write operations are performed on the memory array. The up-down counter may "count down" (e.g., increase a stored count value) when only read operations are performed on the memory array. The stored count value may be maintained and updated selectively by counting up and down. The most updated stored count value may be used to generate the read address.

The multiplexing circuit has a first input that directly receives the length value and a second input that receives the stored count value from the up-down counter.

When operating the configurable storage circuit in a shift register mode, the write and read addresses may be separated by a fixed number of addresses and the fixed number of addresses may be proportional to the received length value. When operating the configurable storage circuit in a simple FIFO mode, the write and read addresses may be separated by a variable number of addresses and the variable number of addresses may be proportional to a number of data entries currently stored in the memory array. The memory array may be accessed using the appropriate read and write addresses generated by the control and arithmetic circuit.

In one suitable application, an integrated circuit may include a configurable storage block connected in series with a processing circuit and a pipeline register. The pipeline register may lack an enable port to receive any enable signals. The configurable storage block may directly receive an enable signal at a read enable port. The configurable storage block may receive the enable signal at a write enable port via a delay circuit (e.g., a register). The configurable storage block may be configured in a simple FIFO mode that is incapable of generate a status signal (e.g., a fill level signal).

Further features of the invention, its nature and various advantages, will be more apparent from the accompanying drawings and the following detailed description of the preferred embodiments.

DETAILED DESCRIPTION

Figure 1:
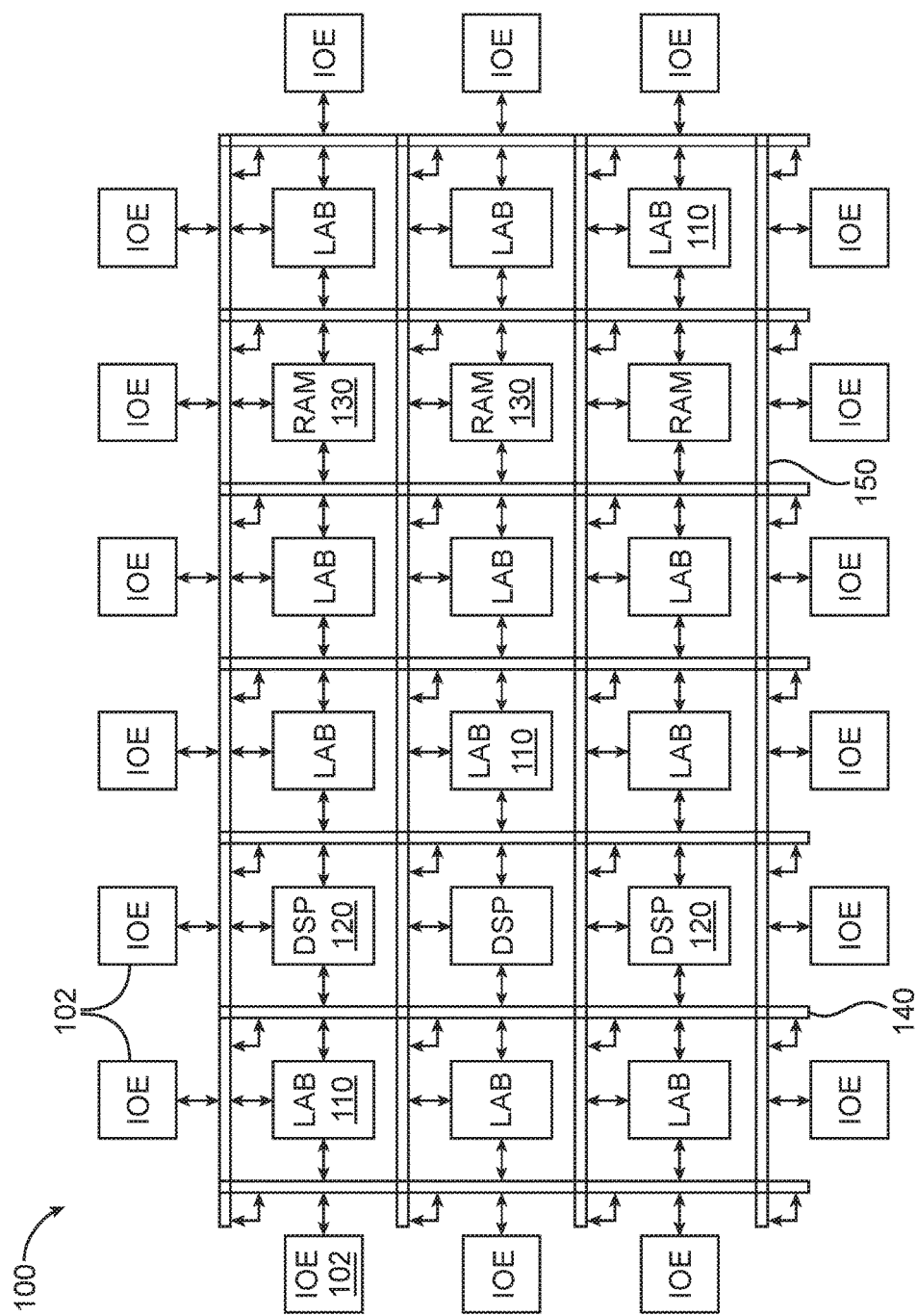
FIG. 1 is a diagram of an illustrative programmable integrated circuit with embedded configurable storage blocks in accordance with an embodiment.

The embodiments described herein relate to integrated circuits and more specifically to configurable storage blocks in an integrated circuit.

Conventional configurable storage blocks often support a pure memory use model in which write operations store data in a memory array at a given address and in which subsequent read operations retrieve the stored data. Typically, only a portion of a user design may perform sue memory operations and this portion may vary depending on the design while some integrated circuits may provide a fixed number of configurable storage blocks. Thus, situations frequently arise where the implementation of a user design on an integrated circuit leaves some of the available configurable storage blocks unused. Consequently, it would be desirable to use these configurable storage blocks for the implementation of other design constructs.

For this purpose, a novel configurable storage block may be provided. Such a configurable storage block may facilitate the efficient implementation of typical design constructs such as shift registers, delay-line modules (DLM), and other design constructs as previously described in U.S. patent application No. 14/530,576, hereby incorporated by reference in its entirety.

In the present embodiment, the configurable storage block may be further implemented as simple first-in first-out (FIFO) modules. Simple FIFO modules (sometimes referred to herein as simple FIFO circuitry) may operate by writing at a write location immediately before a directly preceding write location and reading from the oldest write location that has yet to be read. In other words, simple FIFO circuitry operates as a queue. In particular, a first data element added will be the first data element to be read and removed. Therefore, when a new data element is added, all previously added data elements have to be read and removed before the new data element can be read and removed.

A simple FIFO module may lack status signals (e.g., may be incapable of generating a fill level signal) that a complete FIFO module may have. For example, a complete FIFO module may output status signal EMPTY when there are no data elements within the complete FIFO module, status signal FULL when a maximum allowable number of data elements are stored within the complete FIFO module, etc. Status signals may require extra resources to implement. In certain applications, it may be desirable to implement simple FIFO modules because status signals may be extraneous and waste precious hardware resources.

Providing an integrated circuit with a configurable storage block which allows for efficient implementations of a simple FIFO has several advantages. Such a configurable storage block may implement any simple-FIFO, shift register, or DLM in a user's design and thus mitigate the need for specific logic and routing resources in the integrated circuit, thereby potentially reducing the logic resource usage and routing congestion. The implementation of a simple FIFO, shift register, or DLM in a configurable storage block may also have deterministic timing and improved performance compared to alternative implementations of the same simple FIFO, shift register, or DLM. For example, an engineering change order (ECO) that changes the implementation of the FIFO, shift register, or DLM such as adding or removing a stage or changing the control logic may be performed by reconfiguring the configurable storage block and thus without any impact on routing congestion or timing of the integrated circuit implementation.

It will be recognized by one skilled in the art, that the present exemplary embodiments may be practiced without some or all of these specific details. In other instances, well-known operations have not been described in detail in order not to unnecessarily obscure the present embodiments.

An illustrative embodiment of an integrated circuit such as a programmable integrated circuit 100 is shown in FIG. 1. Programmable integrated circuit 100 may have input-output (I/O) circuitry 102 for driving signals off of programmable integrated circuit 100 and for receiving signals from other devices. Input-output (I/O) circuitry 102 include conventional input-output (I/O) circuitry, serial data transceiver circuitry, differential receiver and transmitter circuitry, or other circuitry used to connect one integrated circuit to another integrated circuit.

As shown, input-output (I/O) circuitry 102 may be located around the periphery of the chip. If desired, the programmable integrated circuit may have input-output (I/O) circuitry 102 arranged in different ways. For example, input-output (I/O) circuitry 102 may form one or more columns of input-output (I/O) circuitry that may be located anywhere on the programmable integrated circuit (e.g., distributed evenly across the width of the programmable integrated circuit). If desired, input-output (I/O) circuitry 102 may form one or more rows of input-output (I/O) elements (e.g., distributed across the height of the programmable integrated circuit). Alternatively, input-output (I/O) circuitry 102 may form islands of input-output (I/O) elements that may be distributed over the surface of the programmable integrated circuit or clustered in selected areas.

Vertical interconnection resources 140 and horizontal interconnection resources 150 such as global and local vertical and horizontal conductive lines and buses may be used to route signals on programmable integrated circuit 100. Vertical and horizontal interconnection resources 140 and 150 include conductive lines and programmable connections between respective conductive lines and are therefore sometimes referred to as programmable interconnects.

Programmable logic regions may include programmable components such as digital signal processing circuitry 120, storage circuitry 130, or other combinational and sequential logic circuitry organized in logic array blocks 110. The programmable logic regions may be configured to perform a custom logic function. If desired, the programmable logic region may include digital signal processing circuitry 120 and storage circuitry 130 which both may be organized in specialized blocks that have limited configurability. The programmable logic region may include additional specialized blocks such as programmable phase-locked loop circuitry, programmable delay-locked loop circuitry, or other specialized blocks with limited configurability.

Programmable integrated circuit 100 contains programmable memory elements. These memory elements can be loaded with configuration data (sometimes also referred to as programming data) using input-output (I/O) circuitry 102. Once loaded, the memory elements each provide a corresponding static control signal that controls the operation of an associated logic component in a programmable logic region.

In a typical scenario, the outputs of the loaded memory elements are applied to the gates of transistors in the programmable logic region to turn certain transistors on or off and thereby configure the logic and the routing paths in the programmable logic region. Programmable logic circuit elements that may be controlled in this way include parts of multiplexers (e.g., multiplexers used for forming routing paths in programmable interconnects or multiplexers used for configuring logic components in a programmable logic region such as digital signal processing circuitry 120 or storage circuitry 130), look-up tables, logic arrays, AND, OR, NAND, and NOR logic gates, pass gates, etc.

Memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements are loaded with configuration data during programming, memory elements are sometimes referred to as configuration memory, configuration RAM, or programmable memory elements.

The circuitry of programmable integrated circuit 100 may be organized using any suitable architecture. As an example, the logic of programmable integrated circuit 100 may be organized in a series of rows and columns of larger programmable logic regions each of which contains multiple smaller logic regions. The smaller regions may be, for example, regions of logic that are sometimes referred to as logic elements (LEs) or basic logic elements (BLEs), each containing a look-up table, one or more registers, and programmable multiplexer circuitry. The smaller regions may also be, for example, regions of logic that are sometimes referred to as adaptive logic modules (ALMs), configurable logic blocks (CLEs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context).

The larger regions may be, for example, logic array blocks 110, which are sometimes also referred to as logic clusters of regions of logic containing multiple logic elements or multiple ALMs. In some embodiments, the larger regions may group several logic elements (LEs) or basic logic elements (BLEs) together to form adder chains or storage circuitry that may be configured as a random-access memory (RAM) block or a simple first-in first-out (FIFO) module, just to name a few.

During device programming, configuration data is loaded into programmable integrated circuit 100 that configures the programmable logic regions so that their logic resources perform desired logic functions.

Figure 2A:
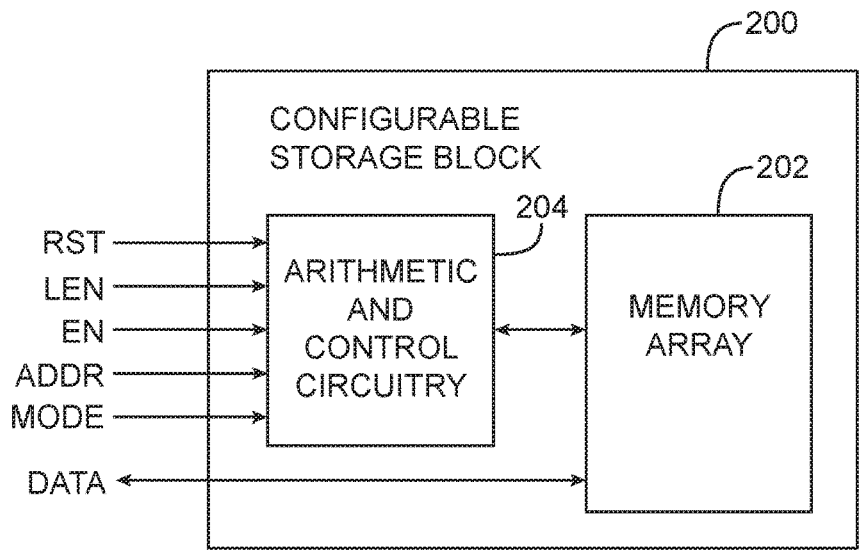
FIG. 2A is a diagram of an illustrative configurable storage block with a memory array and arithmetic and control circuitry in accordance with an embodiment.

At least a portion of storage circuitry 130 or logic array blocks 110 may include configurable storage blocks with added functionality to implement simple FIFOs efficiently. FIG. 2A shows an embodiment of a configurable storage block 200 that may be operated in random-access mode (i.e., as a RAM), in simple FIFO mode (i.e., as a simple FIFO circuit), or in shift register mode (i.e., as a shift register).

As shown, configurable storage block 200 may include memory array 202 and arithmetic and control circuitry 204. Data may be written to memory array 202 through a data-in port and read from memory array 202 through a data-out port of configurable storage block 200. For example, memory array 202 may both receive and send data signals via data input-output port DATA. If desired, there may be dedicated read and write ports (not shown). The write operation and the read operation may be synchronized to a clock signal that configurable storage block 200 may receive at a clock port (not shown). If desired, the write and read operations may be synchronized to different clocks (e.g., a write clock and a read clock) that may be part, of separate clock domains.

Configurable storage block 200 may receive an enable signal at enable port EN. As shown, the enable signal may enable the read and write operations on memory array 202 and operations of arithmetic and control circuitry 201. If desired, the write and read operations may be enabled by different enable signals (e.g., a write enable signal and a read enable signal).

Memory array 202 may include an inbound pipeline for incoming data between port DATA and memory array 202, an outbound pipeline for outgoing data between memory array 202 and port DATA, and an optional bypass selector circuit, for "fall-through" in simple FIFO mode (not shown) in which data is written into the last free location of the simple FIFO and thus data is available at port DATA as an output as soon as the same data enters the memory array at the port DATA as an input.

As shown, arithmetic and control circuitry 204 may receive a reset signal from port RST and a length signal (e.g., a length value) from port LEN of configurable storage block 202 in addition to the enable signal from port EN and a clock signal from a clock port (not shown). If desired, arithmetic and control circuitry 204 may generate read and write address signals based on the received signals. For example, arithmetic and control circuitry 204 may generate an initial write address signal for storing data at a write location of memory array 202 upon receipt of a reset signal. The reset signal may initialize arithmetic and control circuitry 204 to provide a default (e.g., predetermined) write address as a first write address. If desired, after reset, arithmetic and control circuitry 204 may select a suitable location as a first write address (e.g., a first unused address). At a clocking event (e.g., at a rising clock edge or at a failing clock edge, or at both rising and falling clock edges) and based on the enable signal, arithmetic and control circuitry 204 may increase the write address signal by one location in the memory array 202. Thus, two successive write operations are addressing the memory array in a predetermined sequence at two adjacent storage locations.

Similarly, arithmetic control circuitry 204 may generate a read address signal for retrieving data from a read location of memory array 202. For example, at a clocking event and based on the enable signal, arithmetic and control circuitry 204 may generate the read address signal. For example, the read address may be generated based on a subtraction of the length signal LEN from the write enable signal in shift register mode. In other words, the write address and the read address may be separated by a fixed amount (e.g., a fixed number of addresses). As such, length value LEN may be proportional to the fixed amount because the fixed amount may be one less than length value LEN (e.g., the fixed amount equals length value LEN minus one).

As another example, in simple FIFO mode, the read address signal may be generated based on a subtraction of a stored read counter value (e.g., a variable count value generated based on length signal LEN) from the write address signal. In other words, the write address and read address may be separated by a variable amount (e.g., a variable number addresses). As such, the variable count value (equivalent to the number of elements in simple FIFO circuitry) may also be proportional to the variable amount because the variable amount may be one less than the number of elements in the simple FIFO circuitry (e.g., the variable amount equals the stored counter value minus one).

In particular, the write address signal may be N and the read address signal N-Y in simple FIFO mode. Thereby, arithmetic and control circuitry 204 may generate address signals that point to read and write address locations that are a variable number of locations apart (e.g., a variable value Y apart, where Y is continually updated in simple FIFO mode based on write and read enable signals). As such, simple FIFO circuitry of variable length Y (corresponding to a read address subtracted from a write address) is implemented. To distinguish a difference between variable Y separating a read address and a write address and a variable count of the number of elements (e.g., data elements, data entries) stored in a FIFO circuitry X, it is important to note that X=Y+1 or Y=X-1.

At a clocking event (e.g., at a rising clock edge or at a falling clock edge, or at both rising and falling clock edges) and based on a read enable signal (without a write enable signal), arithmetic and control circuitry 204 may increase the read address signal by one location in the memory array 202. In the example above, the write address signal may now be N and the read address signal N-Y-1. Thus, two successive read operations are addressing the memory array in a predetermined sequence at two adjacent storage locations (if simple FIFO circuitry stored a sufficient number of data elements). Arithmetic and control circuitry 204 may generate the corresponding address signals (e.g., the read and write address as a given time).

Arithmetic and control circuitry 204 may receive an address signal from port ADDR in addition to the generated address signals. If desired, the received address signal may include different signals for the write and read operations (i.e., a read address signal and a write address signal).

Arithmetic and control circuitry 204 may select between operating the configurable storage block 200 in a first mode and operating the configurable storage block 200 in a second mode. As an example, arithmetic and control circuitry 204 may select the address signal from port ADDR for accessing memory array 204 for write and read operations, thereby operating configurable storage block 200 as a random-access memory in the first mode. In the second mode, arithmetic and control circuitry 204 may select the generated address signals for accessing memory array 202 for write and read operations, thereby operating configurable storage block 200 as a simple first-in first-out circuit (FIFO), or if desired, a shift register.

Arithmetic and control circuitry 204 may further receive a mode signal via a mode port MODE that selectively enables configurable storage block 200 to operate as a shift register in a first mode, or a simple FIFO in a second mode. The mode signal may be received when configurable storage block 200 is not operating in a RAM mode. For example, when configurable storage block 200 operates in memory mode (e.g., RAM mode), the mode signal received may not affect operations.

If desired, arithmetic and control circuitry 204 may include address registers and store the selected address signal in these address registers to provide for synchronous write and/or read operations. Arithmetic and control circuitry 204 may use the enable signal from port ENA to enable storage of the selected address signals in the address registers.

Figure 2B:
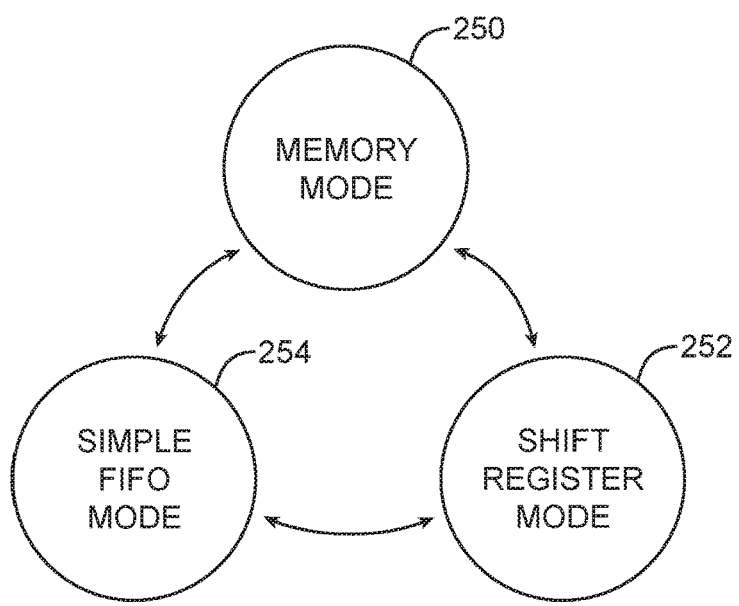
FIG. 2B is a diagram of illustrative modes in which a configurable storage block can be operated in accordance with an embodiment.

FIG. 2B shows three exemplary modes of operation for configurable storage block 200 as shown in FIG. 2A. Configurable storage block 200 may be operated in memory mode 250, shift register mode 252, or simple FIFO mode 254. In addition, configurable storage block 200 operate in other modes, if desired. However, details of the other modes of operation are omitted to not unnecessarily obscure the present embodiments.

As shown in FIG. 2B, configurable storage block 200 may switch between operating in memory mode 250, shift register mode 252, and simple FIFO mode 254. Arithmetic and control circuitry 204 may facilitate the change between the different modes. For example, during a first time period, configurable storage block 200 may operate in memory mode 250. In other words, arithmetic and control circuitry 204 may use address signals received at address port ADDR to access memory array 202 to write or read data.

Transitioning between the first time period and a second time period, configurable storage block 200 may switch from operating in memory mode 250 to operating in shift register mode 252. In other words, a reset signal received at port RST may prompt calculating read and write addresses based on a length value (e.g., a length signal) received at port LEN as previously described in FIG. 2A. A mode signal received at port MODE may also indicate operation in shift register mode 252 (as opposed to simple FIFO mode). The calculated read and write addresses may be used during the second time period to operate configurable storage block 200 in shift register mode.

Transitioning between the second time period and a third time period, configurable storage block 200 may switch from operating in shift register mode 252 to operating in simple FIFO mode 254. If desired, an additional reset signal may be received at port RST to prompt calculating read and write addresses based on an additional length value received at port LEN. The mode signal received at port MODE may be changed (from indicating operation in shift register mode) to indicate operation in simple FIFO mode 254. The newly calculated read and write addresses may be used during the second time period to operate configurable storage block 200 in simple FIFO mode.

Optionally, when changing from operation in shift register mode to operation in simple FIFO mode, read and write addresses corresponding to operation in shift register mode may be maintained in simple FIFO mode, if suitable. In other words, the additional reset signal may be necessary to reset previously calculated read and write addresses in preparation for simple FIFO mode operation.

The transition from memory mode 250 to shift register mode 252 and then to simple FIFO mode 254 is merely illustrative. If desired, any suitable transitions may occur. For example, transitions may include from memory mode to simple FIFO mode, from simple FIFO mode to memory mode, etc. Additionally, transitions may also include other modes of operation of configurable storage block. For example, a transition from memory mode to tapped delay line mode, from shift register mode of a first depth to shift register mode of second depth, etc.

Figure 3:
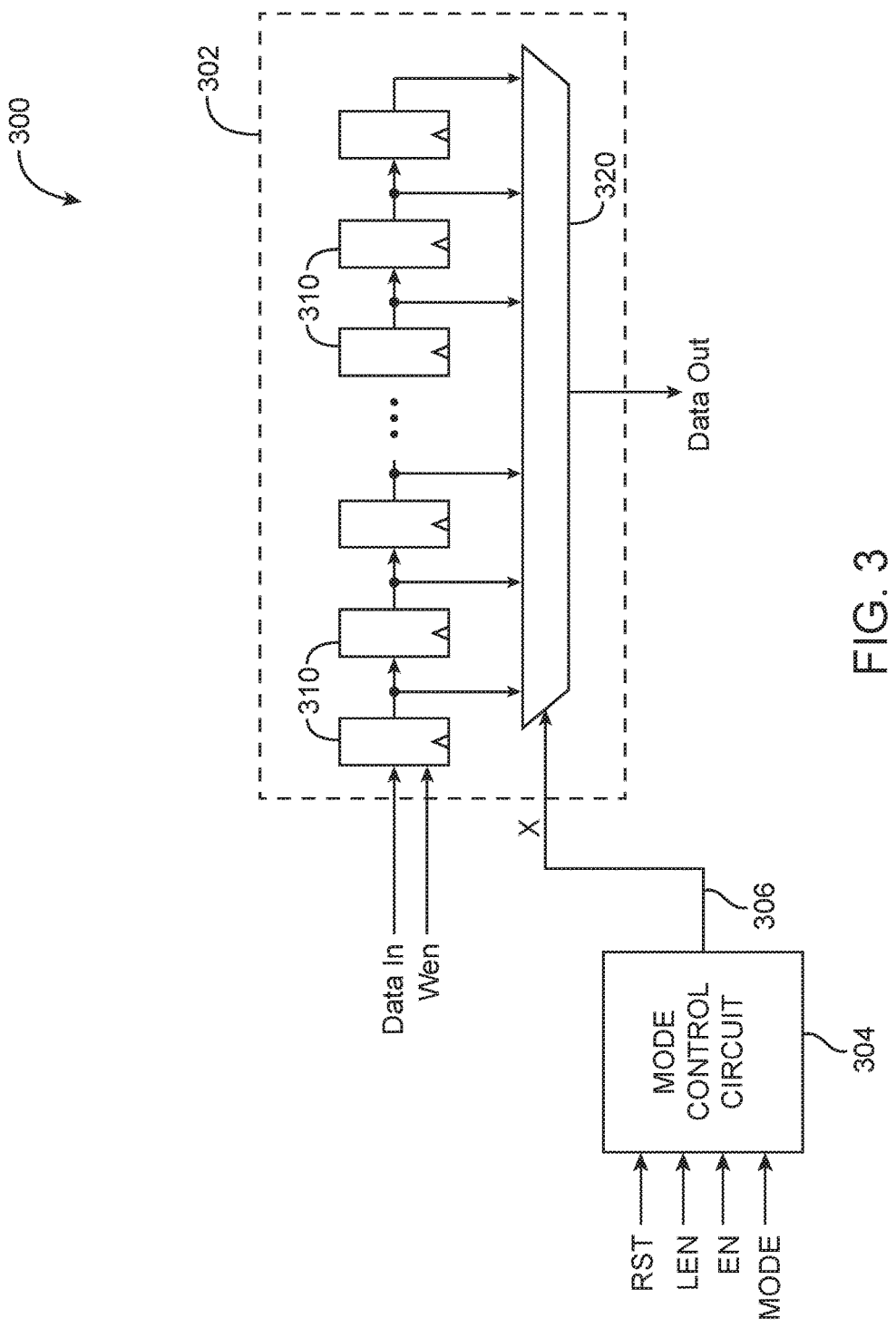
FIG. 3 is a diagram of an illustrative behavioral representation of the configurable storage block of FIG. 2A in simple FIFO mode in accordance with an embodiment.

FIG. 3 shows a diagram of an illustrative behavioral representation of configurable storage block 200 as simple FIFO circuitry 300. Simple FIFO circuitry 300 may include shift register module 302 and mode control circuit 304. Shift register module 302 may be implemented using configurable storage block 200 (e.g., using both arithmetic and control circuit 204 and memory array 202) in FIG. 2A. Shift register module 302 may receive signal DataIn (e.g., via data input-output port DATA in FIG. 2A). Shift register module 302 may also generate signal DataOut (e.g., via data input-output port DATA in FIG. 2A). Signals DataIn and DataOut may be data signals having a same number of bits. The same number of bits may be referred to herein as a data width.

Shift register module 302 may include registers 310 coupled in series as a behavioral representation of configurable storage block 200 in simple FIFO mode or shift register mode. Registers 310 may have a width that corresponds to the data with of signals DataOut and DataIn. Each register 310 and therefore configurable storage block 200 may be configured to be compatible with any suitable data width (e.g., 3 bits, 20 bits, 32 bits, etc.) There may be any suitable number of registers 310, as allowed by hardware constraints of a corresponding configurable storage block. The depth of module 320 may refer to the number of register 310 implemented by a corresponding configurable storage block (e.g., configurable storage block 200 in FIG. 2A).

Shift register module 302 may receive a write enable signal Wen. In particular the leftmost register 310 may receive signal Wen and perform write operations only when signal Wen is received along with input DataIn. Alternatively, shift register module 302 may receive an enable signal EN that enables read operations, write operations, or both. In addition, shift register module 302, and in particular, registers 310 may receive a clock signal (not shown).

Shift register module 302 may also include selection circuitry 320 (e.g., multiplexer 320). The outputs of each register 310 may be tapped. Multiplexer 320 may receive the outputs of each register 310. Control signal X may control multiplexer 320 to select one of the inputs to multiplexer 320 for output. For example, control signal X may select the output for the leftmost register 310. In this example, signal DataOut will be equal to the output of the leftmost register 310.

FIFO circuitry 300 may use mode control circuit 304 to generate control signal X to properly control multiplexer 306 according to a desired mode of operation. In particular, mode control circuit 304 may be implemented within arithmetic and control circuitry 204 in FIG. 2. As such, mode control circuit 304 may receive reset signal RST, length signal LEN, enable signal EN (or separate write enable signal Wen and read enable signal Ren), mode signal MODE, and other suitable signals. For example, mode control circuit 304 may also receive a corresponding clock signal to the clock signal received by shift register module 302.

FIFO circuitry 300 may operate simply as a shift register when control signal X is constant. In other words, in a first mode of operation, circuitry 300 may operate as FIFO circuitry 300, and in a second mode of operation, circuitry 300 may operate as shift register circuitry 300. As previously described in connection with FIG. 2B, mode signal MODE and mode control circuit 304 may determine in which mode circuitry 300 will operate.

When operating circuitry 300 as FIFO circuitry, control signal X may be chosen as a number corresponding to the number of data elements stored within module 302. In fact, control signal X must choose to operate multiplexer 320 to output the earliest data elements written into module 302 to properly operate as FIFO circuitry.

As an example, module 302 may include ten registers 310. However, only the leftmost three registers of the ten registers have stored data elements (referred to as left register 310-1, middle register 310-2, and right register 310-3 of the leftmost three registers). Since module 302 as shown in FIG. 3 writes data into the left most registers first, control signal X may provide a value of three to read and remove the output of right register 310-3 during a read operation. Because the output from right register 310-3 is read out and right register 310-3 is emptied, during a subsequent read operation, control signal X may provide a value of two to read and remove the output middle register 310-3 during the subsequent read operation (assuming no write operations have taken place).

This example is merely illustrative. If desired, control signal X may be accordingly updated during read operations, write operations, and simultaneous read and write operations in simple FIFO mode. Control signal X should be accordingly updated (e.g., changed or maintained) when performing any memory access operations.

In contrast, when operating circuitry 300 as shift register circuitry, control signal X may be a constant (e.g., provide module 302 with a constant number of usable registers whether empty or not). However, to implement shift register circuitry with a different number of usable registers, control signal X may be changed to a different constant.

Figure 4:
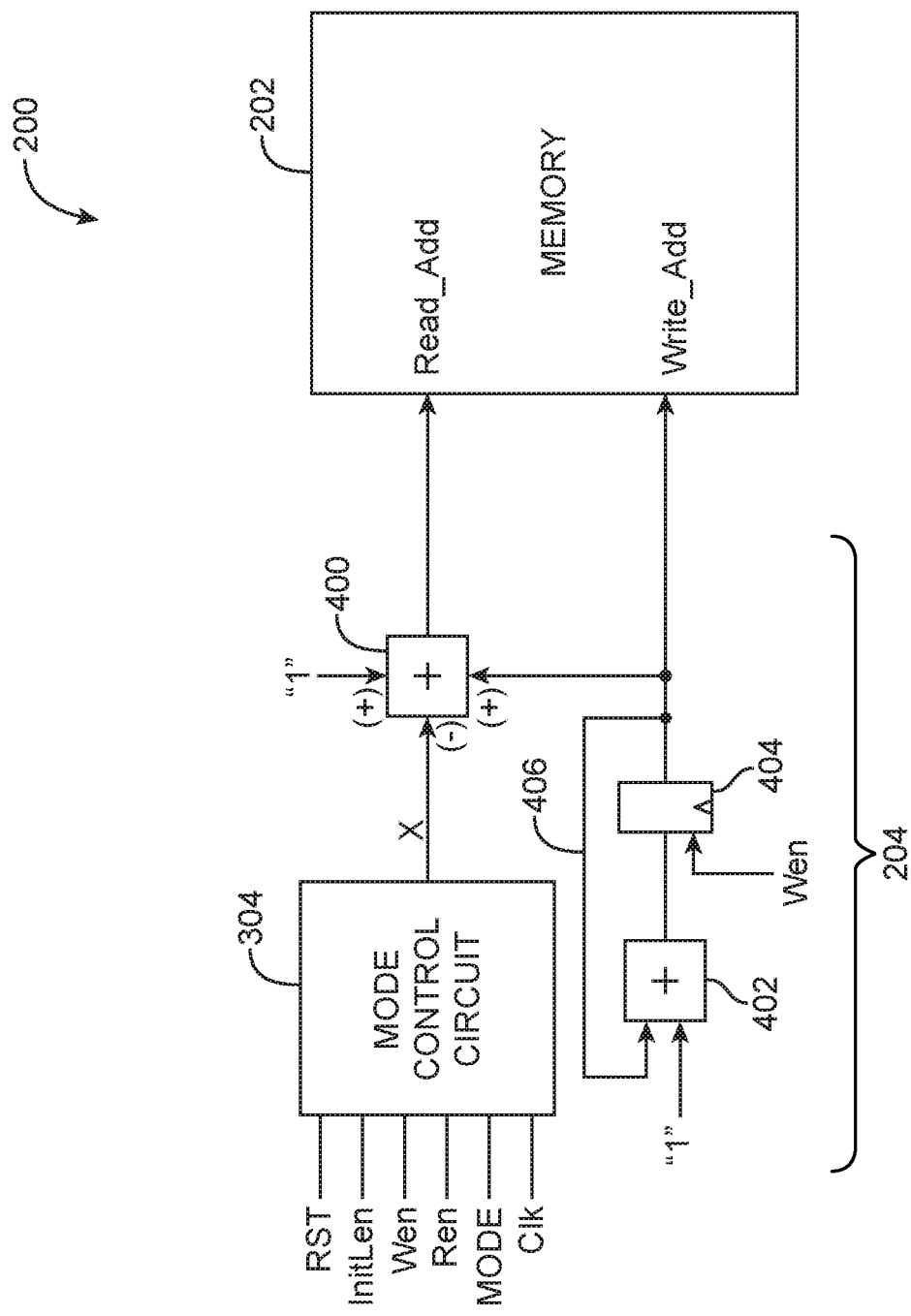
FIG. 4 is a block diagram of an illustrative configurable storage block used as simple FIFO circuitry in accordance with an embodiment.

FIG. 4 shows a diagram of an illustrative circuit implementation (e.g., an exemplary physical representation) of configurable storage block 200. In particular, memory array 202 (or simply memory 202) may include read address port Read_add and write address port Write_Add. Memory 202 may include additional ports and other suitable peripheral circuitry, which are omitted to avoid unnecessarily obscuring the current embodiments. For example, memory 202 may also include data input ports and data output ports, as described in connection with FIG. 2A.

As shown in FIG. 4, arithmetic and control circuitry 204 in FIG. 2 may include mode control circuit 304, arithmetic circuitry 400 (e.g., addition circuitry 400), counter circuitry 402, and register 404. Counter circuitry 402 and register 404 may be collectively referred to herein as a write address generation circuit. Arithmetic and control circuitry 204 may similarly include additional ports and other suitable circuitry, which are omitted to avoid unnecessarily obscuring the current embodiments.

Mode control circuit 304 in FIG. 4 may operate similarly as described in FIG. 3. However, mode control circuit 304 in FIG. 4 may receive separate read and write enable signals Ren and Wen, respectively. Mode control circuit 304 in FIG. 4 receives a clock signal Clk. Mode control circuit 304 in FIG. 4 may receive initial length signal InitLen (sometimes referred to herein as initial length value InitLen) corresponding to length signal LEN.

Initial length value InitLen may be used interchangeably as length value LEN. Initial length value InitLen is used to highlight that an initial length may not be equivalent to an effectively length when operating configurable storage block 200 as FIFO circuitry. The initial length corresponding to a number of registers 310 in FIG. 3 with stored elements at the beginning of operating configurable storage block 200 as FIFO circuitry may change after performing memory access operations. The change is reflected in count value X (equaling the effective length) that is generated by mode control circuit 304. Count value X (referred to previously as control signal X in the logic representation of FIG. 3) may be used to generate a read address in a physical representation (e.g., physical configuration), thereby "controlling" the data read out by configurable storage block 200.

Count value X may be received at a negative input terminal of addition circuitry 400. Addition circuitry 400 may also include a positive input terminal and an output terminal coupled to read address port Read_Add of memory 202. In other words, count value X generated by mode control circuit 304 may be subtracted from an input received at the positive input terminal of addition circuitry 400 to generate a resulting address provided as a read address to memory 202. A value "1" may also be received at a third terminal of addition circuitry 400 to account for the fact that count value X relates to a number of elements. As previously described, to distinguish a difference between variable Y separating a read address and a write address and a variable count of the number of data entries stored in a simple FIFO circuitry (e.g., count value X), it is important to note that X=Y+1 or Y=X−1.

To generate the input received at the positive input terminal of addition circuitry 400, counter circuit 402 may receive a logic value of "1" to enable counting by 1's (e.g., monotonic counting by one). An output of counter circuit 402 may be received as a data input for register 404. Register 404 may further receive write enable signal Wen. When write enable signal Wen is asserted and when register 404 is clocked, the output of counter circuit 402 may be stored at register 404. The output of register 404 may be coupled to another second input of counter circuit 402 to enable continual counting using feedback path 406.

In other words, only when performing a write operation, a "count value" (e.g., the output of register 404) may be incremented by one. Performing a subsequent write operation further increases the count value by one, and so on. If desired, reset operations may occur to reset the count value. In other words, counter circuit 402 may be resettable to reset the count value to zero or any suitable number.

The output of register 404 may be further coupled to the positive input terminal of addition circuitry 400 and to write address port Write_Add of memory 202.

Figure 5:
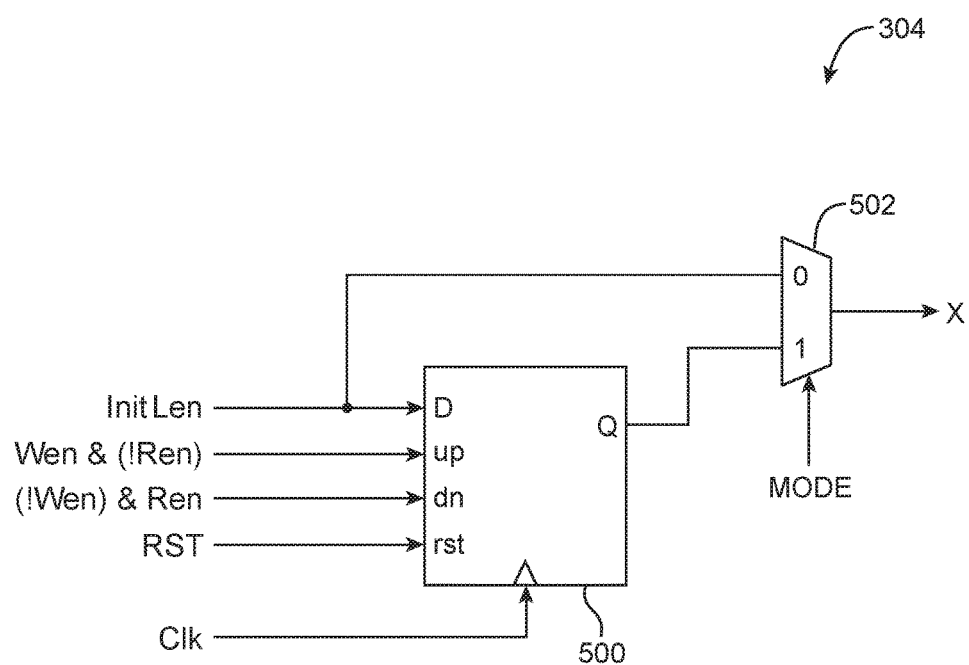
FIG. 5 is a diagram of illustrative counter and selection circuitry for selectively enabling simple FIFO mode in accordance with an embodiment.

FIG. 5 shows a circuit diagram of mode control circuit 304. As shown in FIG. 5, mode control circuit 304 may include up-down counter 500 and selection circuitry 502 (e.g., a multiplexer 502). Up-down counter 500 may receive initial length signal InitLen at data input port D, reset signal RST at reset port rst, and clock signal Clk. Up-down counter 500 may also receive a first logic input signal (sometimes referred to herein as a write logic signal) at port up and a second logic input signal (sometimes referred to herein as a read logic signal) at port dn. Up-down counter 500 may use its inputs to generate counter value Q (sometimes referred to herein as address value Q).

Selection circuitry 502 may receive initial length value InitLen as a first data input and address value Q as a second data input. Selection circuitry 502 may further receive mode control signal MODE. As an example, when control signal MODE provides a value of "0" to selection circuitry 502, initial length value InitLen may be used as an output for selection circuitry 502. When control signal MODE provides a value of "1" to selection circuitry 502, address value Q generated by up-down counter may be used as an output for selection circuitry 502. This is merely illustrative. If desired, any suitable control values may be provided to selection circuitry 502 to properly operate mode control circuit 304.

The write logic signal may be computed using logic expression Wen & (!Ren), where Wen is a write enable signal, and Ren is a read enable signal. In other words, when performing write operations without performing read operations, the write logic signal may be at a value of logic "1." Otherwise the write logic signal may be at a value of logic "0." Analogously, the read logic signal may be computed using logic expression (!Wen) & Ren. In other words, when performing read operations without performing write operations, the read logic signal may be at a value of logic "1." Otherwise the read logic signal may be at a value of logic "0."

The read and write logic signals may be generated using circuitry within arithmetic and control circuitry 204 in FIG. 2A. For example, to generate the read logic signal, write enable signal Wen may be provided to an inverter. The output of the inverter may be coupled a first input of a logic AND gate. Read enable signal Ren may be coupled to a second input of the logic AND gate. The output of the logic AND gate is the read logic signal. The write logic signal may be similarly generated. This is merely illustrative. If desired, any suitable circuitry (e.g., logic gates, inverters, etc.) may be used to generate the read and write logic signals.

Up-down counter 500 may maintain and update a count value during operation of configurable storage block 200 in a FIFO mode. Unless otherwise specified, after resetting up-down counter 500, the count value becomes a length value provided by length signal InitLen. Thereafter, when port up receives a logic "1" value, the count value may be incremented by one, and the new count value may replace the previous count value. Analogously, when port dn receives a logic "1" value, the count value may be decremented by one, and the new count value may replace the previous count value. Otherwise, the count value maintained at up-down counter 500. The currently maintained count value is provided as an output of up-down counter (e.g., address value Q). In other words, when only the write enable signal is asserted, the up-down counter counts in a first direction (e.g., a positive direction). When only the read enable signal is asserted, the up-down counter counts in a second direction (e.g., a negative direction).

If desired, when configurable storage block 200 is not operating in a FIFO mode, up-down counter 500 may be bypassed. For example, when configurable storage block 200 is operating in a shift register mode, length signal InitLen (corresponding to the depth of the implemented shift register) may be provided via multiplexer 502 as count value X.

Figure 6A:
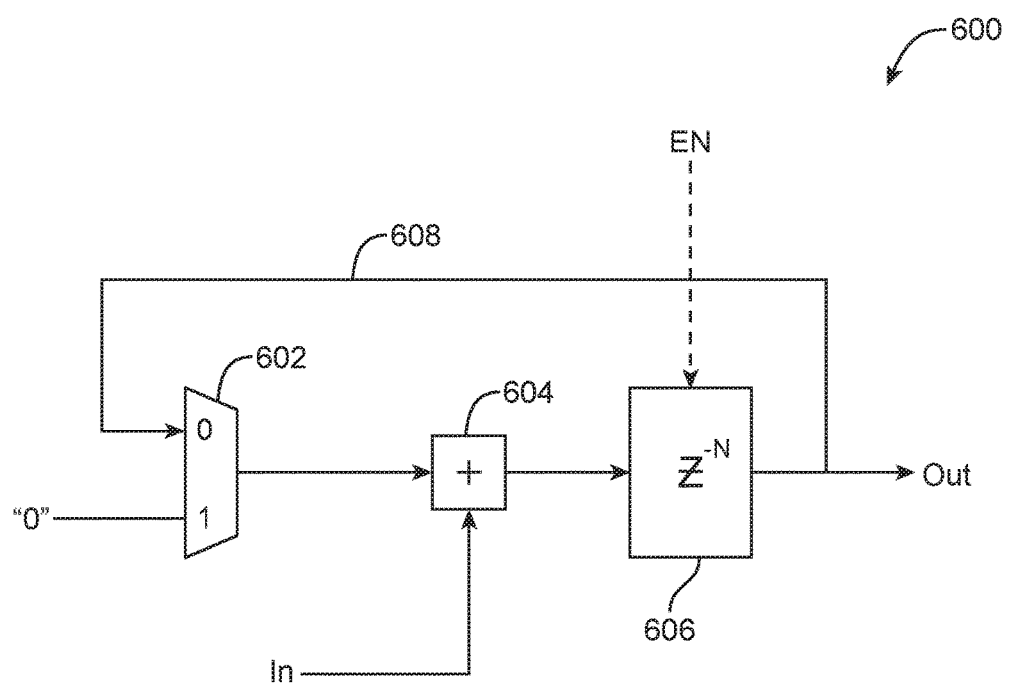
FIG. 6A is a diagram of an accumulator circuit that requires an enabled delay block.

FIG. 6A is a diagram of a processing circuit such as accumulator circuit 600. Accumulator circuit 600 may include multiplexer 602, addition circuit 604, and delay circuit 606. Using multiplexer 602, addition circuit 604, and delay circuit 606, accumulator circuit 600 may generate output value Out (e.g., an accumulated output value Out). Output value Out may be generated by summing a previous output value by an input value. Multiplexer 602 may receive output value Out at a first data input terminal (e.g., terminal "0") and a logic value "0" at a second data input terminal (e.g., terminal "1"). A control signal (not shown) for multiplexer 602 may select one of the first and second data input terminals for output. Output value Out may be provided to the first data input terminal via feedback path 608 (to enable summing a previous output value by a new input value).

The output of multiplexer 602 may be received by addition circuit 604 at a first input terminal. The output of multiplexer 602 may be added to input In from a second input terminal (e.g., the new input value to be summed with the previous output value). The sum generated by addition circuit 604 may be provided to delay circuit 606. Delay circuit 606 may provide a desired delay (e.g., delay N) to the sum before outputting the sum as output value Out.

By continually selecting terminal "0" (e.g., the first data input terminal that receives output value Out via feedback path 608) for output, accumulator circuit 600 may continually add values to output value Out. Accumulator circuit 600 may be reset at suitable time. After reset, the control signal may select the logic value "0" at the second data input terminal for output.

During operation of accumulator circuit 600, downstream circuitry that receives output value Out from accumulator 600 may not be ready to receive output value Out. It is desirable to provide enable signal EN to delay circuit 606 to implement a delay until the downstream circuitry is ready to receive output value Out.

However, in such a configuration, enable signals analogous to enable signal EN for delay circuit 606 must also be provided to any intervening registers (e.g., pipeline registers) within accumulator circuit 600. Pipeline registers are registers that may be selectively enabled or disabled to allow an efficient flow of data with a minimal allowable delay for data transfer (e.g., to remove bottlenecked operations). Pipeline registers or simple registers may not be implementable with enable inputs or reset inputs. It may also be resource-intensive to provide all registers with the enable and reset inputs. Therefore, it may be desirable to provide accumulator 600 with configurable storage block 200 in simple FIFO mode, for example.

Figure 6B:
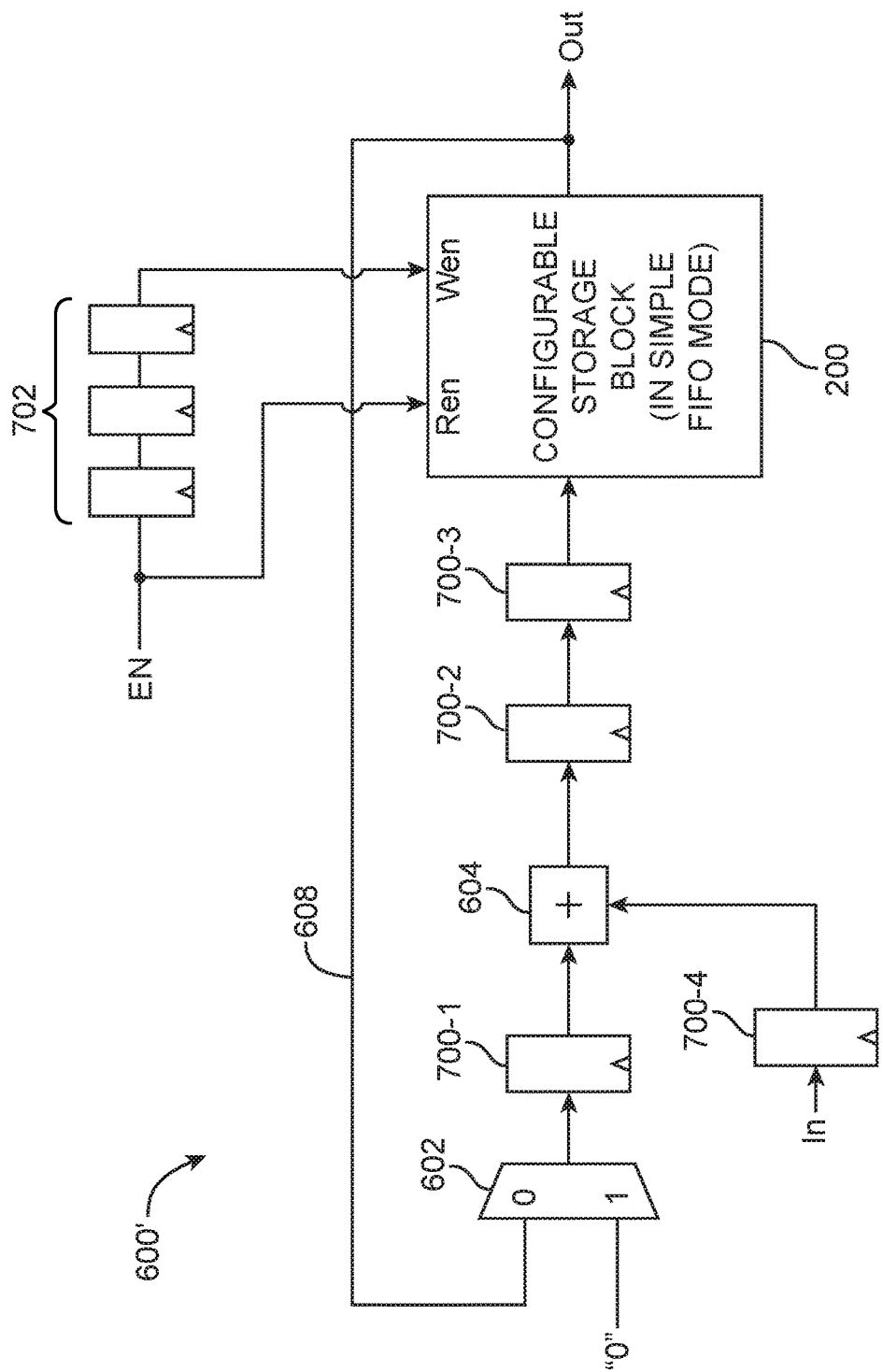
FIG. 6B is a diagram of an illustrative accumulator circuit that uses a configurable storage block in simple FIFO mode in accordance with an embodiment.

As shown in FIG. 6B, processing circuit 600' (sometimes referred to herein as arithmetic circuit 600' or accumulator circuit 600') may have register 700-1 interposed between multiplexer 602 and addition circuit 604. Registers 700-2 and 700-3 may be interposed between addition circuit 604 and configurable storage block 200. Register 700-4 may be interposed between input In and addition circuit 604. Configurable storage block 200 may generate output value Out. Configurable storable block 200 may operate in simple FIFO mode as described in connection with FIGS. 1-5.

Registers 700-1, 700-2, and 700-3 may be registers that lack an enable port to receive an enable signal (e.g., pipeline registers, simple registers, etc.). Registers 700-1, 700-2, and 700-3 may also be not resettable (i.e., registers 700 also lack a reset port). Configurable storage block 200 may receive enable signal EN at read enable port Ren as a read enable signal. Configurable storage block 200 may also receive enable signal EN at write enable port Wen through registers 702.

Each register within registers 702 may represent a one clock cycle delay. A number of registers within registers 702 and a length (e.g., a depth) of configurable storage block operating in simple FIFO mode (e.g., simple FIFO 200) may be determined according to the needs of the system. For example, accumulator circuit 600' may operate as an 8-channel accumulator (e.g., at any given time, accumulator circuit 600' may store eight sets of computations). In such a scenario, registers 702 may arbitrarily include three registers. However, to efficiently storage eight sets of computations, the length of simple FIFO circuitry 200 may be five such that the five "registers" (e.g., logic representation of registers) within simple FIFO circuitry 200 and the three registers 702 sum to eight. Alternatively, if registers 702 includes four registers, the depth of simple FIFO circuitry 200 may be four to provide 8-channel capabilities.

The example of an 8-channel accumulator is merely illustrative. If desired, an accumulator any channel size may be use simple FIFO circuitry of a suitable depth in combination with a suitable number of registers (e.g., analogous to registers 702).

The examples shown in FIGS. 6A and 6B are merely illustrative. If desired, configurable storage block 200 operating in simple FIFO mode may be provided to any upstream circuitry (e.g., a processing circuit, an arithmetic circuit), where a corresponding downstream circuitry may require a delay (e.g., a pause) in operations to properly operate. For example, downstream circuitry may be a computational circuitry running computational tasks for a first process. Upstream circuitry to the computational circuitry may be ready to send tasks for a second process. However, a delay may be required to finish the first task before the upstream circuitry sends the tasks for the second process. The delay may be implemented by a configurable storage block operating in simple FIFO Mode.

Figure 7:
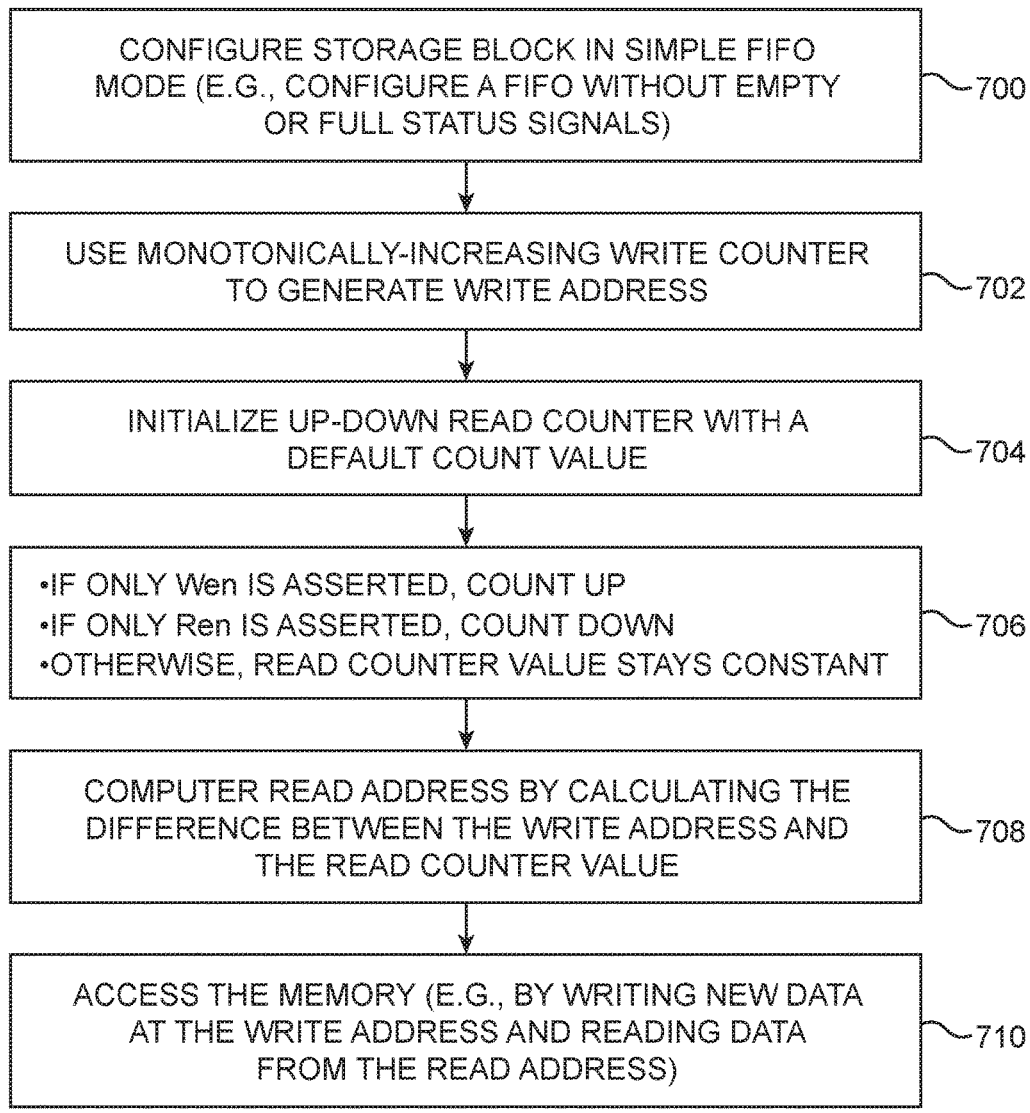
FIG. 7 is a flow chart showing illustrative steps for operating a configurable storage block in simple FIFO mode in accordance with an embodiment.

FIG. 7 shows a diagram of illustrative steps for operating a configurable storage block (e.g., configurable storage block 200) as simple FIFO circuitry. In particular, at step 700, the configurable storage block may receive be configured to operate in simple FIFO mode. For example, configurable storage block may operate as FIFO circuitry without status signals (e.g., EMPTY status signal, FULL status signal, etc.). To configure the storage block, configurable storage block may receive an asserted reset signal, an initial length signal, and an asserted MODE signal as described in FIGS. 2A and 2B.

At step 702, a monotonically-increasing counter (e.g., addition circuit 402 and register 404 in FIG. 4) may generate a write address. The monotonically-increasing counter may keep track of addresses previously written on. Therefore, the generated write address may be an address that is empty (e.g., does not stored any data).

At step 704, an up-down read counter (e.g., up-down counter 500 in FIG. 5) may be initialized using the asserted reset signal (e.g., signal RST). The up-down read counter may be initialized to a given count value. The count value may be a default (e.g., predetermined) count value.

At step 706, when a write enable signal (e.g., enable signal Wen) is asserted, the up-down counter "counts up" or updates a stored count value (e.g., a stored read counter value) by increasing the stored count value by one. When a read enable signal (e.g., enable signal Ren) is asserted, the up-down counter "counts down" or updates the stored count value by decreasing the stored count value by one. In any other scenario, the stored read counter value remains constant. For example, when both read and write enable signals are asserted simultaneously, the stored read counter value remains constant.

At step 708, arithmetic circuitry (e.g., arithmetic circuit 400) may generate a read address based on the read counter value and the write address. In particular, the arithmetic circuitry may calculate the difference between the write address and the read counter value. The difference may be the read address.

At step 710, the storage block and in particular the memory array within the storage block (e.g., memory 202) may be accessed using the generated read and write addresses. For example, new data (e.g., data entries data elements, elements) may be written in the memory array at the generated write address. Stored data entries may be read from the memory array at the generated read address. The stored data is removed during the read operation.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using configurable storage blocks is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A configurable storage circuit, comprising:
a memory array;
a write address generation circuit that generates a write address for accessing the memory array; and
a control circuit that receives a length value and that generates a read address for accessing the memory array based on the received length value, wherein the write address and the read address are separated by a fixed amount while the configurable storage circuit is configured in a shift register mode, and wherein the fixed amount is equal to one less than the length value while the configurable storage circuit is configured in the shift register mode.

2. The configurable storage circuit of claim 1, wherein the write address and the read address are separated by a variable amount while the configurable storage circuit is configured in a first-in first-out (FIFO) mode.

3. The configurable storage circuit of claim 2, wherein the variable amount is equal to one less than a number of data entries currently stored in the memory array while the configurable storage circuit is configured in the first-in first-out (FIFO) mode.

4. The configurable storage circuit of claim 1, wherein the control circuit includes a multiplexing circuit.

5. A configurable storage circuit, comprising:
a memory array;
a write address generation circuit that generates a write address for accessing the memory array; and
a control circuit that receives a value and that generates a read address for accessing the memory array based on the received value, wherein the control circuit includes a multiplexing circuit, wherein the control circuit further includes a counter of a first type, wherein the write address generation circuit includes a counter of a second type that is different than the first type, and wherein, in a shift register mode, the write address and the read address are separated by a fixed amount that is equal to one less than the value.

6. The configurable storage circuit of claim 5, wherein the counter in the control circuit comprises an up-down counter.

7. The configurable storage circuit of claim 6, wherein the multiplexing circuit has a first input that directly receives the value and a second input that receives a count value from the up-down counter.

8. The configurable storage circuit of claim 7, wherein the control circuit receives a write enable signal and a read enable signal, and wherein the up-down counter counts in a first direction when only the write enable signal is asserted and counts in a second direction that is different than the first direction when only the read enable signal is asserted.

9. A method of operating a configurable storage circuit, comprising:
with a write address generator in the configurable storage circuit, generating a write address;
with a control circuit in the configurable storage circuit, receiving a value and generating a corresponding count value based on the value;
operating the configurable storage circuit in a first-in first-out mode by selectively adjusting the count value;
computing a read address based on the write address and the count value; and
accessing a memory array in the configurable storage circuit using the write address and the read address.

10. The method of claim 9, further comprising:
operating the configurable storage circuit in a shift register mode by setting the count value equal to the received value.

11. The method of claim 9, wherein generating the count value comprises using an up-down counter to count up in response to only writing into the memory array and to count down in response to only reading from the memory array.

12. The method of claim 11, wherein the control circuit includes a multiplexer with a first input, a second input, and an output, the method further comprising:
with the multiplexer, receiving the value at its first input, receiving the count value at its second input, outputting the value at its output when the configurable storage circuit is operated in a first mode, and outputting the count value at its output when the configurable storage circuit is operated in the first-in first-out mode.

* * * * *